(12) United States Patent
Dippel

(10) Patent No.: US 11,249,301 B2
(45) Date of Patent: Feb. 15, 2022

(54) SYNCHRONOUS HIGH SPEED SHUTTER FOR SENSOR PROTECTION

(71) Applicant: BAE SYSTEMS Information and Electronic Systems Integration Inc., Nashua, NH (US)

(72) Inventor: George F. Dippel, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 353 days.

(21) Appl. No.: 16/658,465

(22) Filed: Oct. 21, 2019

(65) Prior Publication Data

US 2021/0116699 A1   Apr. 22, 2021

(51) Int. Cl.
| | |
|---|---|
| *G02B 26/02* | (2006.01) |
| *G21K 1/04* | (2006.01) |
| *G01J 5/20* | (2006.01) |
| *H01L 23/552* | (2006.01) |
| *G02B 26/04* | (2006.01) |

(52) U.S. Cl.
CPC ............ *G02B 26/02* (2013.01); *G01J 5/20* (2013.01); *G02B 26/04* (2013.01); *G21K 1/04* (2013.01); *H01L 23/552* (2013.01)

(58) Field of Classification Search
CPC .......... G02B 26/02; G02B 26/04; G01J 5/20; G21K 1/04; H01L 23/552
See application file for complete search history.

(56) References Cited

U.S. PATENT DOCUMENTS

| | | | |
|---|---|---|---|
| 6,404,494 B1 * | 6/2002 | Masonis | G01N 21/53 250/574 |
| 2016/0216507 A1 * | 7/2016 | Danehy | G02B 26/0833 |
| 2019/0064323 A1 * | 2/2019 | Mayer | G01S 7/4808 |

* cited by examiner

*Primary Examiner* — Hugh Maupin
(74) *Attorney, Agent, or Firm* — Maine Cernota & Rardin

(57) ABSTRACT

A system for a synchronous high speed shutter for sensor protection comprising a shutter disk having a rotational axis; wherein the rotational axis of the shutter disk is perpendicular to an optical axis of the sensor. A plurality of paired reflecting elements on the shutter disk, perpendicular to a surface of the shutter disk, wherein a polished surface of each of the plurality of paired reflecting elements is figured to match an angle (f #) of an incoming ray bundle; whereby incoming radiation is directed back out collecting optics; wherein the sensor comprises a single photon Geiger mode detector, and whereby the sensor is protected from damage by over-current due to a flood of photons.

20 Claims, 6 Drawing Sheets

APPLICATION ENVIRONMENT

DEVICE CONFIGURATION (NOT TO SCALE)

PERPENDICULAR - AXIS OPEN SHUTTER PERSPECTIVE VIEW

PERPENDICULAR - AXIS SHUTTER ORTHOGONAL VIEW

LIGHT TRANSMISSION

METHOD STEPS

SYNCHRONOUS HIGH SPEED SHUTTER FOR SENSOR PROTECTION

FIELD OF THE DISCLOSURE

This disclosure relates to sensor device protection, more particularly, to a synchronous high speed shutter for sensor protection.

BACKGROUND

Increased sensor sensitivity is critical for many applications. Application examples include LIDAR, Time of Flight (ToF) 3D Imaging, PET scanning, single-photon experimentation, fluorescence lifetime microscopy, and optical communications. These can implement single photon detection sensors, outputting a pulse upon receiving a single photon. Single-Photon Avalanche Diodes (SPADs) employ the incident radiation-triggered avalanche current of a p-n junction when reverse biased. SPADs operate with a reverse-bias voltage well above the breakdown voltage (Geiger-mode) as opposed to the linear-mode. With this high sensitivity comes high susceptibility to damage from even small amounts of incident radiation.

It is very difficult to maintain high sensitivity and prevent damage. Splash back can cause a blind period which eliminates returns from closer objects. While active quenching allows sensors to reset however, even with quenching circuitry, they can be damaged by over-current due to a flood of photons. Simple gating of the sensor will not prevent damage. Mechanical shutters involving blades are not fast enough to allow higher repetition rates and they have limited lifetimes. Tuning fork shutters are fixed frequency and closed/open ratios are limited. They also do not easily allow matching to the optical system. Fast steering mirrors can deflect incoming backscatter over small angles, but a beam dump may be required to prevent stray light reflections. Fast steering mirrors also require special drive electronics. Digital Light Modulators may be fast enough, but they also pose the problem of how to eliminate the deflected backscatter. What is needed is a device, system, and method to protect high sensitivity sensors from damage that can be accurately matched to the optical system, is reliable, and has reduced size and weight.

SUMMARY

An embodiment provides a synchronous high speed shutter device for sensor protection comprising a shutter disk having a rotational axis; wherein the rotational axis of the shutter disk is approximately perpendicular to an optical axis of the sensor; and at least one reflecting element pair on the shutter disk, approximately perpendicular to a surface of the shutter disk; wherein the at least one reflecting element reflects incoming radiation away from the sensor; whereby the sensor is protected from damage by over-current due to a flood of photons. In embodiments the shutter disk axis of rotation lies in an interim focal plane of a receiver optics telescope. In other embodiments, the sensor comprises a single photon Geiger mode detector. In subsequent embodiments the sensor is protected from high power laser back scatter caused by close-in objects. For additional embodiments the diameter of the shutter disk is based on the rotation speed of the shutter disk and the timing of blocking versus open states. In another embodiment, the device comprises a reference source. For a following embodiment the device comprises a shutter servo motor locked to a reference source. In subsequent embodiments the position of the at least one reflecting element pair comprises two blocks. In additional embodiments the curvature of the at least one reflecting element outer surface matches a wave front of the incoming light. In included embodiments a polished surface of the least one reflecting element is figured to match an angle (f #) of an incoming ray bundle; whereby incoming radiation is directed back out the collecting optics. In yet further embodiments the diameter of the shutter disk is about 30 mm, a shutter cycle repetition rate is about 200 Hz, and a rotational speed of the shutter disk is about 3,000 rpm. In related embodiments the device comprises an active imaging detection system. For further embodiments the device comprises active imaging, wherein reflected energy is included near the end of the outgoing pulse. In ensuing embodiments the device comprises a temporal beam modulator for lock-in techniques.

Another embodiment provides A method for a synchronous high speed shutter for sensor protection comprising providing a synchronous high speed shutter device for sensor protection comprising a shutter disk having a rotational axis, wherein the rotational axis of the shutter disk is approximately perpendicular to an optical axis of the sensor; and at least one reflecting element pair on the shutter disk, approximately perpendicular to a surface of the shutter disk; determining a reference source frequency; phase locking a shutter motor of the synchronous high speed shutter device to the reference source frequency; disabling the sensor; triggering the laser when the sensor is blocked; enabling the sensor; delaying to allow sensor array operation; and returning to disabling the sensor. For yet further embodiments, operation comprises a variable frequency. For more embodiments, the motor rpm, a disk radius, a number and a width of each of the at least one reflecting element in each pair of elements contributes to a shutter cycle repetition rate and blanking versus receive time. Continued embodiments include the method comprises a shutter cycle repetition rate of about 200 Hz, and a rotational speed of the shutter disk is about 3,000 rpm. For additional embodiments, the sensor comprises a single photon Geiger mode detector.

A yet further embodiment provides a system for a synchronous high speed shutter for sensor protection comprising a shutter disk having a rotational axis; wherein the rotational axis of the shutter disk is approximately perpendicular to an optical axis of the sensor; a plurality of paired reflecting elements on the shutter disk, approximately perpendicular to a surface of the shutter disk, wherein a polished surface of each of the plurality of paired reflecting elements is figured to match an angle (f #) of an incoming ray bundle; whereby incoming radiation is directed back out collecting optics; wherein the sensor comprises a single photon Geiger mode detector; and whereby the sensor is protected from damage by over-current due to a flood of photons.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The invention is capable of many embodiments. What follows is illustrative, but not exhaustive, of the scope of the invention.

Embodiments provide protection of high sensitivity sensors from high power laser back scatter caused by close-in objects. Embodiments use a rotary shutter located at an interim focal plane of the sensor (telescope) optics. The shutter motor is locked to a reference source, and provides a positional signal to trigger the laser when the sensor is blocked. Shutter embodiments comprise a disk with reflecting elements that are perpendicular to the disk surface. In embodiments, the blocking elements are placed on the disk circumference. The shutter rotates on an axis perpendicular to the sensor optical axis. The reflecting elements present a curved, polished, optical surface to the incoming backscatter that matches the curvature of the incoming wave front. This directs the incoming radiation back out the collecting optics. For embodiments, the reflecting surface is figured to match the angle (f #) of the incoming ray bundle. This projects the light right back out the same path. Applications include active imaging, and this reflected energy would be included near the end of the outgoing light pulse. Embodiments can be used as a temporal beam modulator for lock-in techniques.

Motor rpm, disk radius, number, and width of reflectors all contribute to the repetition rate and blanking vs receive time. Locating the disk axis at an interim focal plane allows a reduced size and weight of the shutter. In embodiments, the shutter diameter is based on the rotation speed and the timing of blocking vs open states. As an example: diameters of 30 mm relate to a 200 Hz repetition rate. The repetition rate relates to a 3000 rpm rotational speed with two blocks. In embodiments, a small servo motor operates this. Motors have an excellent lifetime and are light weight. Examples include designs from mechanical gyros. In embodiments there are no negative effects due to vibration, and little power is required, so heat load is minimal.

Figure 1:
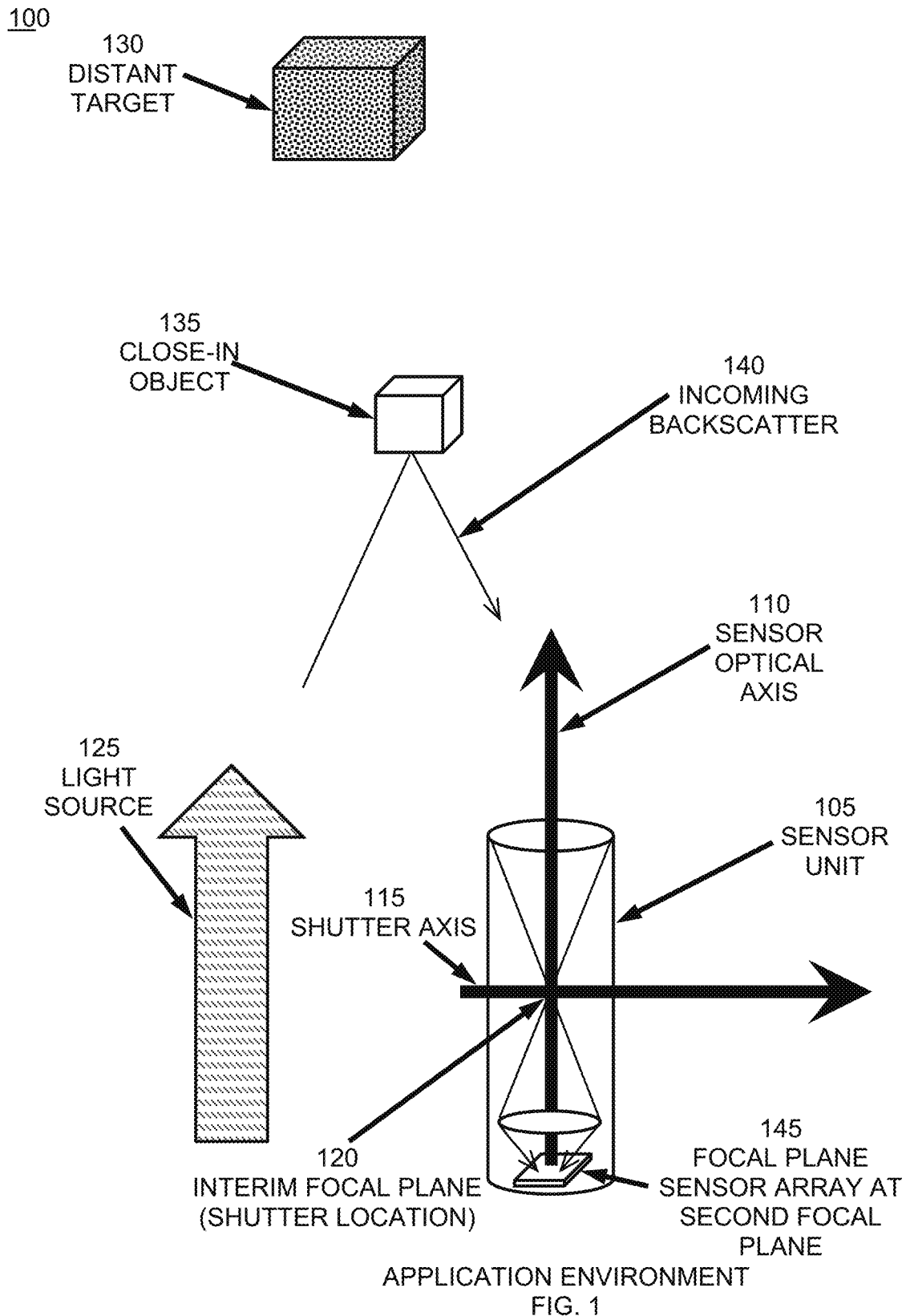
FIG. 1 illustrates an application environment in accordance with an embodiment.

FIG. 1 illustrates an application environment 100. Sensor unit 105 has an optical axis 110 perpendicular to shutter axis 115. The shutter on shutter-axis 115 is located at interim focal plane 120. Light source 125 is directed toward distant object 130. Close-in object 135 produces incoming backscatter 140. Sensor unit 105 includes a high-sensitivity sensor 145 that can be damaged by incoming backscatter 140. Sensor unit 105 includes a synchronous high speed shutter that has a shutter axis 115 and protects the high-sensitivity sensor element of sensor unit 105. In embodiments, high-sensitivity sensor 145 is a focal plane array at the second focal plane.

Figure 2:
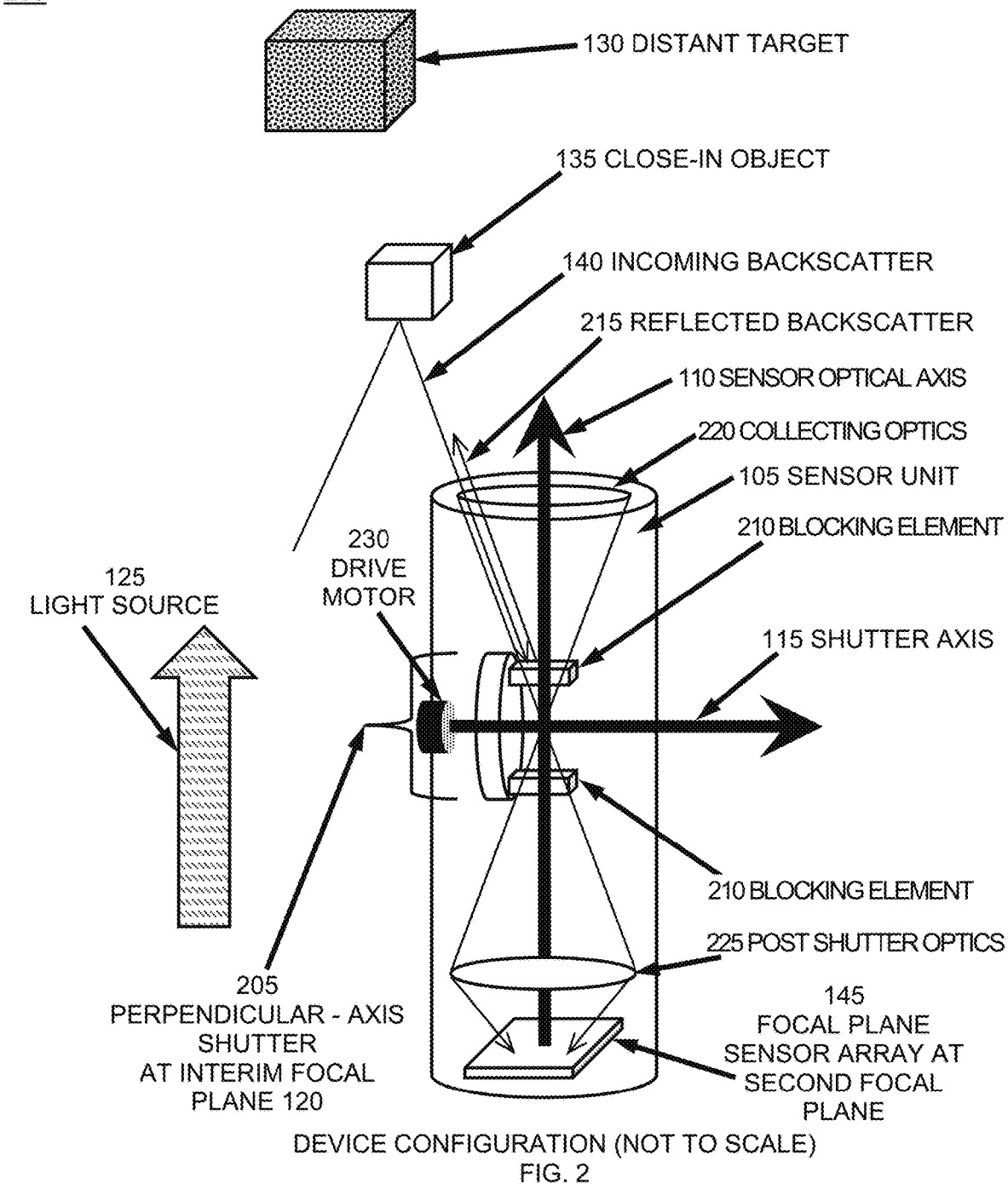
FIG. 2 illustrates a device configuration in accordance with an embodiment.

FIG. 2 illustrates a device configuration 200. Here too, sensor unit 105 has an optical axis 110 perpendicular to shutter axis 115. Light source 125 is directed toward distant object 130, and close-in object 135 produces incoming backscatter 140. Sensor unit 105 includes a high-sensitivity sensor element 145 that can be damaged by incoming backscatter 140. Further depicted are perpendicular-axis shutter 205 and blocking elements 210 mounted on perpendicular-axis shutter 205. Blocking elements 210 reflect incoming backscatter radiation 140 out back through collecting optics 220, creating reflected backscatter 215. Embodiments comprise post-shutter optics 225 and drive motor 230. The rotating shutter disk is mounted on the shaft of servo motor 230. In embodiments, there is a closed loop control of both the speed and position of the motor shaft. Appropriate sensors provide control feedback to the drive system. The motor rotation is locked to an electronic reference. In example embodiments, controllers used to control navigational gyros are employed. The controller is designed to be matched to the requirements of the shutter and the appropriate servo motor.

Figure 3:
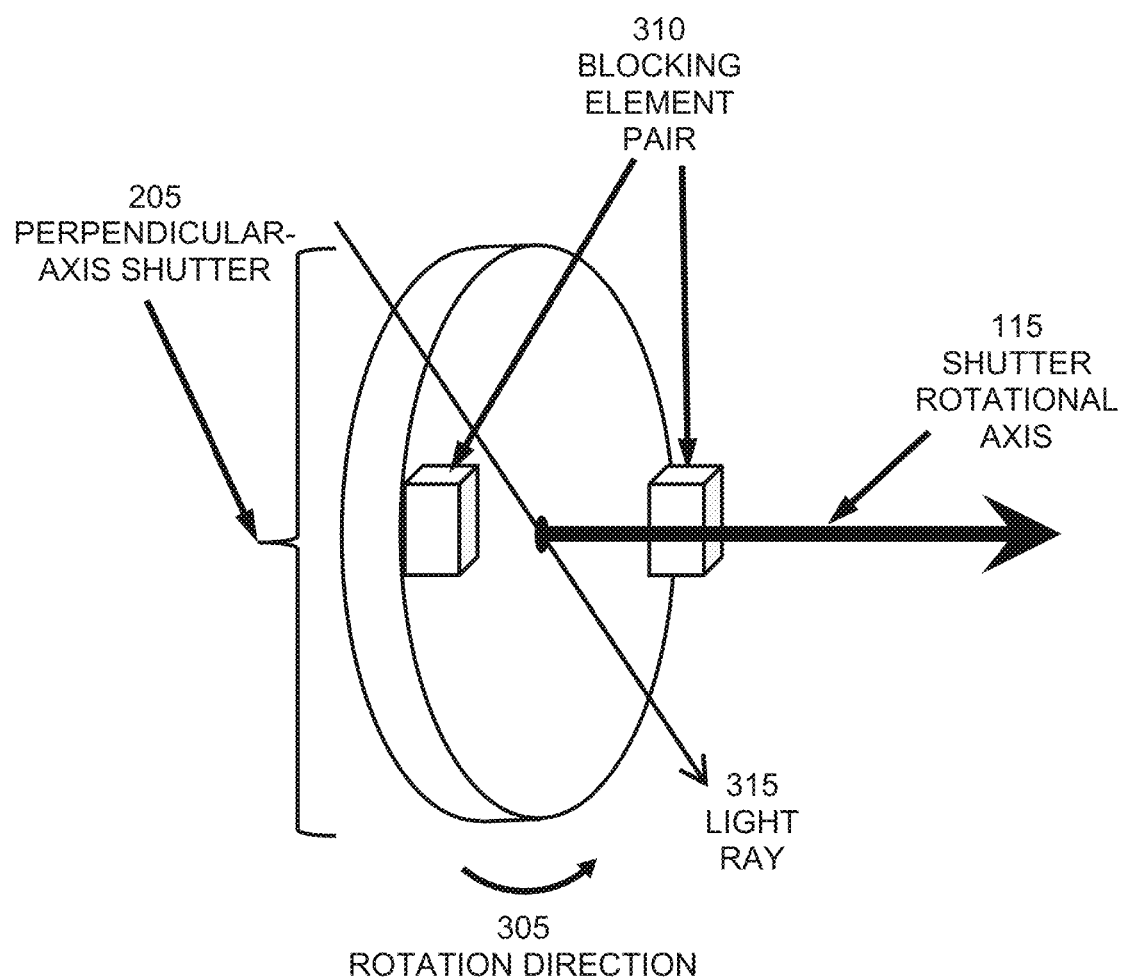
FIG. 3 depicts a perpendicular-axis shutter perspective view configured in accordance with an embodiment.

FIG. 3 depicts a perpendicular-axis open shutter perspective view 300. Perpendicular-axis shutter 205 has a rotation direction 305 about shutter rotational axis 115, and has a pair of blocking elements 310. Further depicted is light ray 315. Light ray 315 passes between blocking elements 310 and reaches the high-sensitivity sensor element.

Figure 4:
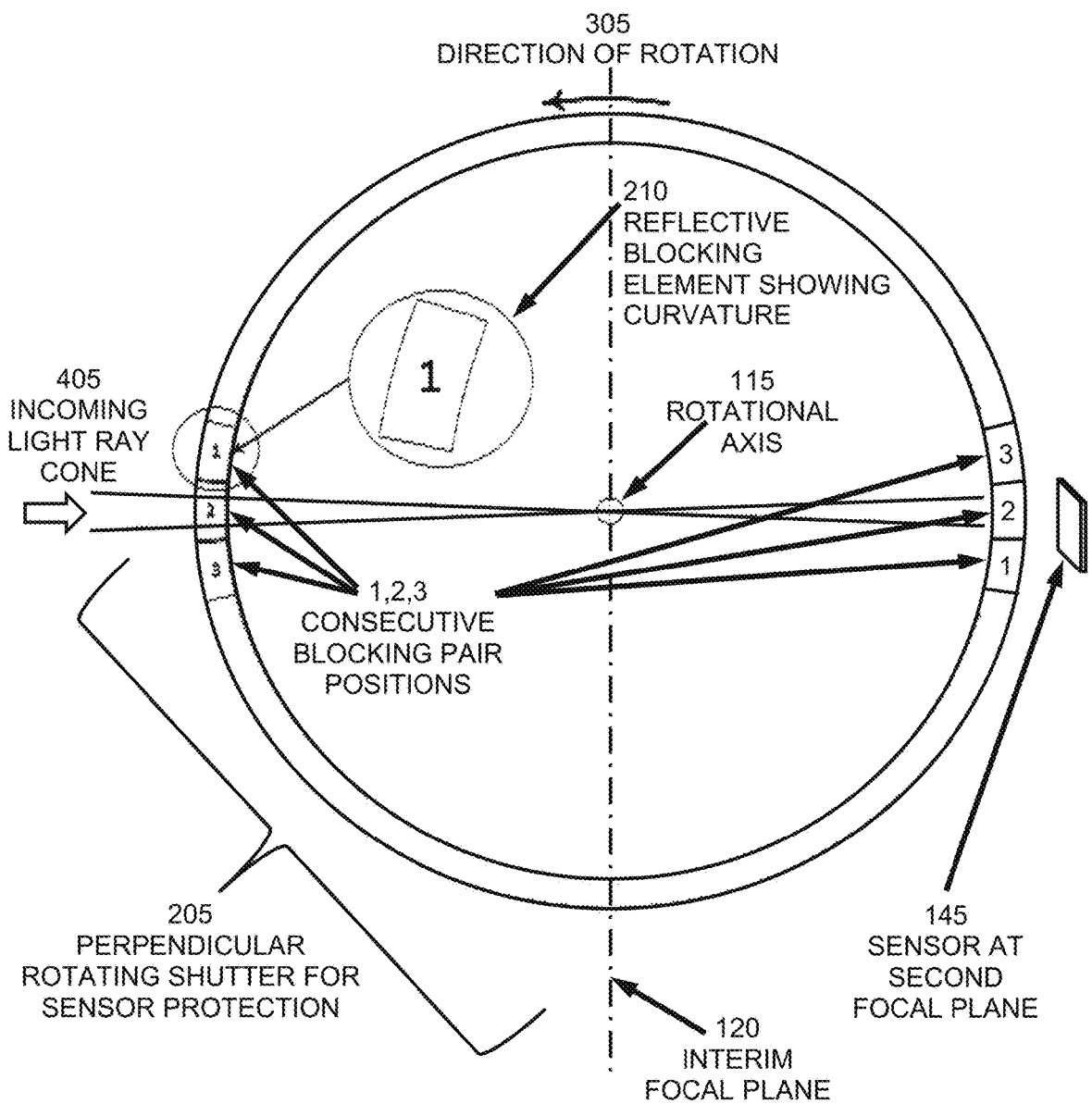
FIG. 4 is perpendicular-axis shutter orthogonal view configured in accordance with an embodiment.

FIG. 4 is perpendicular-axis shutter orthogonal view 400. Rotating shutter 205 is shown having rotational axis 115 and direction of rotation 305. Incoming light ray cone 405 impinges on reflective blocking element 210, depending on timing. Reflective blocking element 210 is shown having curvature, causing a reflected light ray 215 to return back through collecting optics 220 as depicted in FIG. 2. 1, 2, 3 refer to consecutive rotational positions of two diametrically opposed reflective blocking element pairs 310. In embodiments, reflective blocking elements 210 are in pairs to maintain rotational balance. Sensor 145 is located outside the shutter, at the second focal plane of the optical system. Not depicted here is the set of optics after the shutter, shown in FIG. 2. The shutter position is used to determine the laser firing pulse timing. The laser is prevented from firing until the blocking elements are in place. The blocking period is determined by the blocking element angular width and the motor rotational speed. In essence, the shutter is not reacting to a "blocking" signal so shutter speed is not an issue. The shutter protects actively illuminated sensor systems in much the same way as gated imaging.

Figure 5:
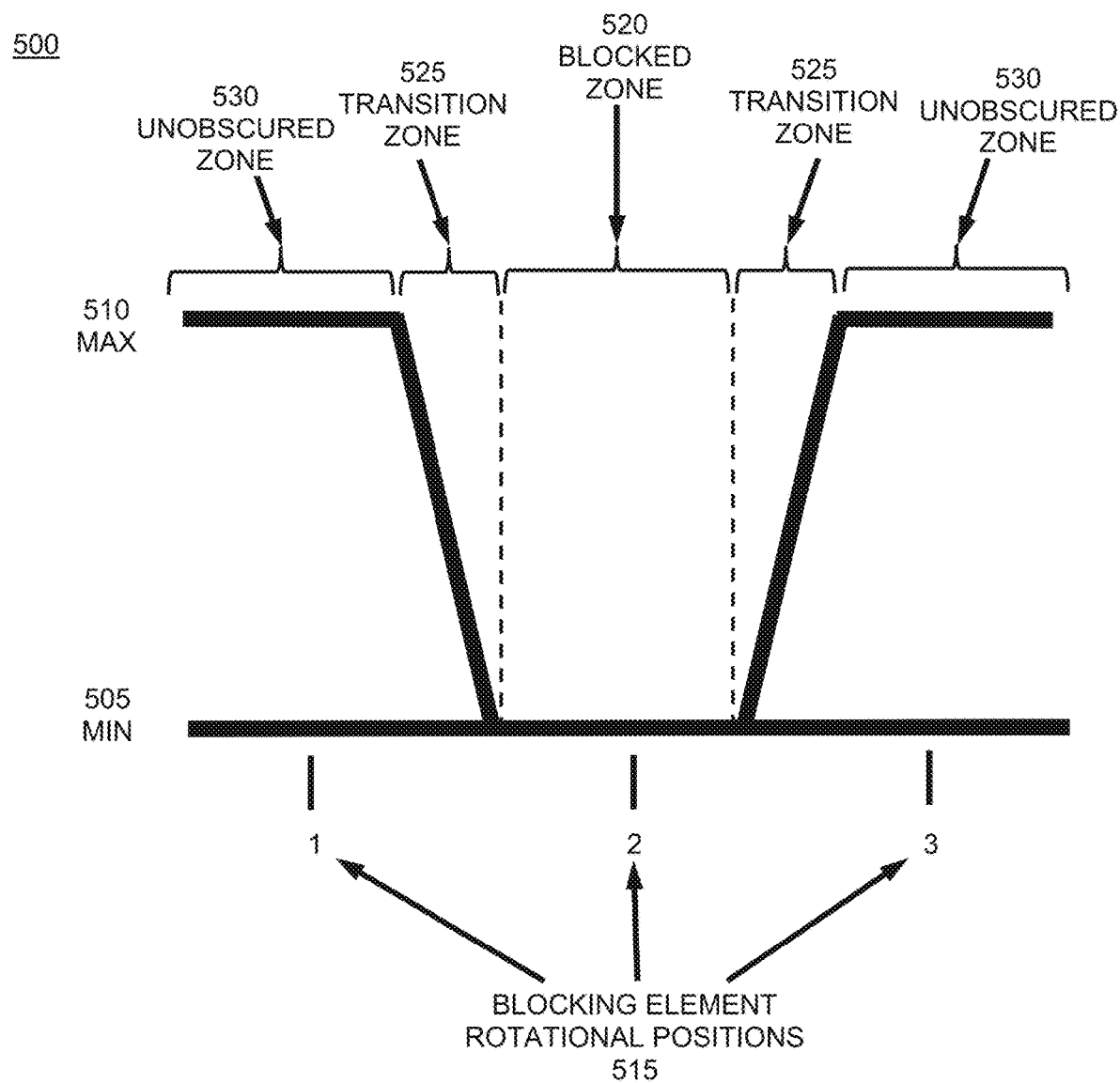
FIG. 5 depicts light transmission configured in accordance with an embodiment.

FIG. 5 depicts light transmission 500. Reflective blocking elements 210 of FIG. 4 correspond to sections of light transmission plot 500. Light transmission levels are minimum 505 to maximum 510. Blocking element pair rotational positions 515 are shown. Blocked zone 520 is created by reflection of light when reflective blocking element 210 is at position 2 of FIG. 4, located in light ray cone 405. Transitional zones 525 depict partial obscuration of the light, and unobscured zones 530 indicate sections with no blocking elements, positions 1 and 3.

Figure 6:
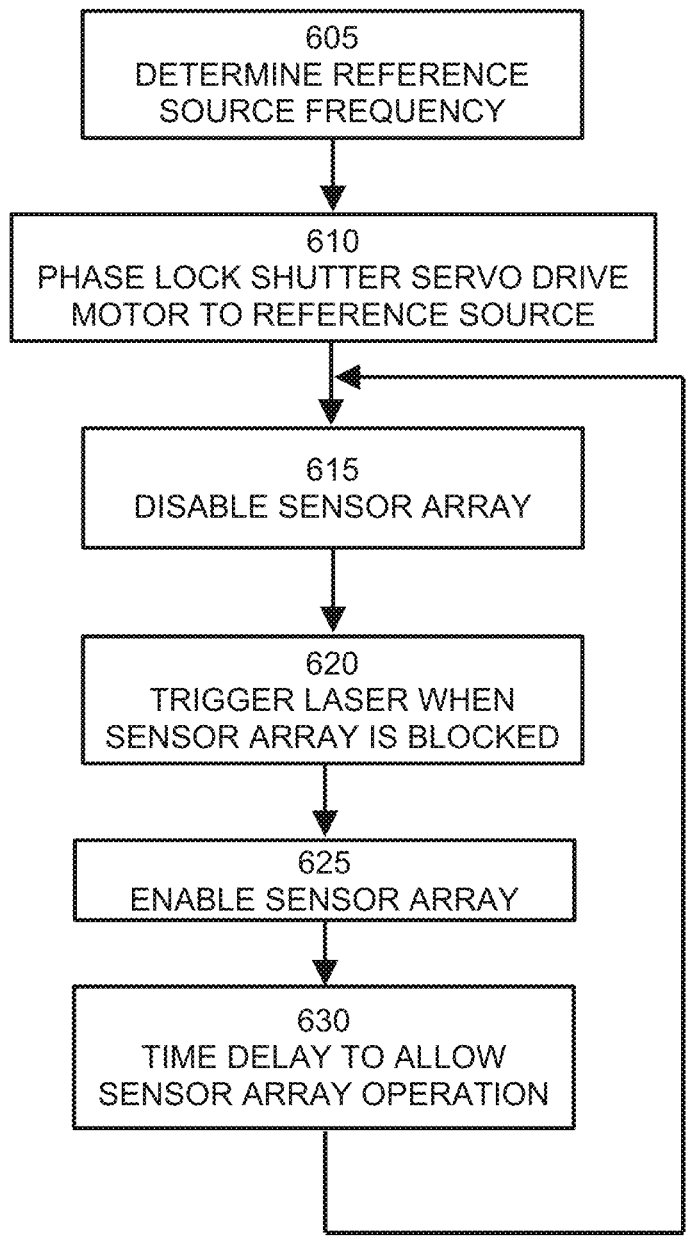
FIG. 6 depicts method steps configured in accordance with an embodiment.

FIG. 6 depicts a flow chart 600 for method steps for sensor protection by a synchronous high speed shutter. Steps comprise determining a reference source frequency 605; phase locking the shutter servo drive motor to the reference source 610; disabling the sensor array 615; triggering the laser when the sensor array is blocked 620; enabling the sensor array 625; delaying to allow sensor array operation 630; returning to disabling sensor array 615. In embodiments, since the motor rotation is locked to an electronic reference by the control system, it is synchronous with a master system clock. For embodiments, this is the same clock that is used to generate the delay period for the laser pulses.

The foregoing description of the embodiments has been presented for the purposes of illustration and description. It is not intended to be exhaustive or to limit the invention to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. A synchronous high speed shutter device for sensor protection comprising:
   a shutter disk having a rotational axis;
   wherein said rotational axis of said shutter disk is approximately perpendicular to an optical axis of said sensor; and
   at least one reflecting element pair on said shutter disk, approximately perpendicular to a surface of said shutter disk;
   wherein said at least one reflecting element reflects incoming radiation away from said sensor;
   whereby said sensor is protected from damage by overcurrent due to a flood of photons.

2. The device of claim 1, wherein said shutter disk axis of rotation lies in an interim focal plane of a receiver optics telescope.

3. The device of claim 1, wherein said sensor comprises a single photon Geiger mode detector.

4. The device of claim 1, wherein said sensor is protected from high power laser back scatter caused by close-in objects.

5. The device of claim 1, wherein a diameter of said shutter disk is based on a rotation speed of said shutter disk and a timing of blocking versus open states.

6. The device of claim 1, wherein said device comprises a reference source.

7. The device of claim 1, wherein said device comprises a shutter servo motor locked to a reference source.

8. The device of claim 1, wherein a position of said at least one reflecting element pair comprises two blocks.

9. The device of claim 1, wherein a curvature of said at least one reflecting element outer surface matches a wave front of incoming light.

10. The device of claim 1, wherein said wherein a polished surface of said least one reflecting element is figured to match an angle (f #) of an incoming ray bundle; whereby incoming radiation is directed back out collecting optics.

11. The device of claim 1, wherein said a diameter of said shutter disk is about 30 mm, a shutter cycle repetition rate is about 200 Hz, and a rotational speed of said shutter disk is about 3,000 rpm.

12. The device of claim 1, wherein said device comprises an active imaging detection system.

13. The device of claim 1, wherein said device comprises active imaging, wherein reflected energy is included near the end of the outgoing pulse.

14. The device of claim 1, wherein said device comprises a temporal beam modulator for lock-in techniques.

15. A method for a synchronous high speed shutter for sensor protection comprising:
   providing a synchronous high speed shutter device for sensor protection comprising:
      a shutter disk having a rotational axis, wherein said rotational axis of said shutter disk is approximately perpendicular to an optical axis of said sensor; and
      at least one reflecting element pair on said shutter disk, approximately perpendicular to a surface of said shutter disk;
   determining a reference source frequency;
   phase locking a shutter motor of said synchronous high speed shutter device to said reference source frequency;
   disabling said sensor;
   triggering said laser when said sensor is blocked;
   enabling said sensor;
   delaying to allow sensor array operation; and
   returning to disabling said sensor.

16. The method of claim 15, wherein operation comprises a variable frequency.

17. The method of claim 15, wherein a motor rpm, a disk radius, a number and a width of each of said at least one reflecting element in each pair of elements contributes to a shutter cycle repetition rate and blanking versus receive time.

18. The method of claim 15, wherein said method comprises a shutter cycle repetition rate of about 200 Hz, and a rotational speed of said shutter disk is about 3,000 rpm.

19. The method of claim 15, wherein said sensor comprises a single photon Geiger mode detector.

20. A system for a synchronous high speed shutter for sensor protection comprising:
   a shutter disk having a rotational axis;
   wherein said rotational axis of said shutter disk is approximately perpendicular to an optical axis of said sensor;
   a plurality of paired reflecting elements on said shutter disk, approximately perpendicular to a surface of said shutter disk, wherein a polished surface of each of said plurality of paired reflecting elements is figured to match an angle (f #) of an incoming ray bundle; whereby incoming radiation is directed back out collecting optics;
   wherein said sensor comprises a single photon Geiger mode detector; and
   whereby said sensor is protected from damage by overcurrent due to a flood of photons.

* * * * *